United States Patent [19]

Mikoshiba et al.

[11] 4,233,530
[45] Nov. 11, 1980

[54] ELASTIC SURFACE WAVE DEVICE

[75] Inventors: Nobuo Mikoshiba, Sendai; Shoichi Minagawa, Ageo, both of Japan

[73] Assignee: Clarion Co., Ltd., Tokyo, Japan

[21] Appl. No.: 948,826

[22] Filed: Oct. 5, 1978

[51] Int. Cl.² ............................................. H03F 7/00
[52] U.S. Cl. ..................................... 307/424; 330/5.5
[58] Field of Search ....................... 330/5.5; 307/424; 333/150, 195; 331/107 A

[56] References Cited

U.S. PATENT DOCUMENTS

| | | | |
|---|---|---|---|
| 3,388,334 | 6/1968 | Adler | 330/5.5 |
| 3,679,985 | 7/1972 | Fang et al. | 330/5.5 X |

Primary Examiner—Rudolph V. Rolinec
Assistant Examiner—Darwin R. Hostetter
Attorney, Agent, or Firm—Wallenstein, Spangenberg, Hattis & Strampel

[57] ABSTRACT

An elastic surface wave device, especially amplifier which includes input and output means for electrical signals provided so as to be spaced on a surface of a piezoelectric material which composes a laminate in combination with a semiconductor, and an electrode provided in a surface signal wave propagation path between said input and output means for application of a d.c. bias voltage and supply of a pumping power.

4 Claims, 4 Drawing Figures

ELASTIC SURFACE WAVE DEVICE

BACKGROUND OF THE INVENTION

This invention relates to an elastic surface wave device, and more particularly to an elastic surface wave device operative by a parametric amplifying effect.

An elastic surface wave amplifier is a solid-state amplifier which generally employs a piezoelectric semiconductor or a suitable combination of a semiconductor and a piezoelectric material, and attains a desired amplification effect by interaction between an elastic surface wave (hereinafter referred to as "surface wave") and a semiconductor charge.

In a conventional elastic surface wave amplifier, a piezoelectric material such as lithium niobate and a semiconductor are disposed oppositely so as to be spaced a distance of about 1,000 Å and a d.c. voltage is applied to the semiconductor in a direction along the surface of the semiconductor which defines the gap to accomplish an amplifying operation by the interaction between a semiconductor charge and a surface wave caused by such application of the d.c. voltage.

This conventional amplifier, however, has a defect that continuous wave cannot be obtained due to Joule heat generated by the d.c. current. It has another difficulty in integration because of its non-monolithic structure.

There have been other conventional devices than that of d.c. voltage-application type, which utilize a parametric amplification effect. One of them is so constructed that a semiconductor material such as Si is provided in the propagation path of travelling wave on a piezoelectric material through a conductive liquid and so operated that a surface signal wave and a pumping wave (travelling wave) are travelled in the same direction at a portion of the piezoelectric material and a space capacitance nonlinearity at a portion of the semiconductor is utilized to attain amplification of the surface signal wave.

This device, however, has such disadvantages that since the frequency of the pumping wave is much higher than that of the surface signal wave, there is some difficulty in the preparation of transducers for generating the pumping waves, and that since necessary pumping power is increased due to generation of harmonic components of the pumping wave, there is caused some disadvantage in actual operation. It has further disadvantage in integration, too.

Another type of conventional parametric amplifier is so operated that with respect to surface wave signal propagating on a piezoelectric material, an exciting voltage is applied to a metal electrode provided in the propagation path for exciting the piezoelectric material at the relevant portion, thereby to amplify the surface signal wave propagating through the piezoelectric material due to nonlinear effect of the very piezoelectric material.

SUMMARY OF THE INVENTION

The present invention has been achieved to solve the above-mentioned tasks outstanding in the art.

It is therefore an object of the present invention to provide an elastic surface wave device which comprises a laminate formed of a semiconductor layer and a piezoelectric layer and a metal electrode for supply of a d.c. bias voltage and an a.c. electrical signal is provided at the surface portion of the piezoelectric layer for conversion between an a.c. electrical signal and a surface wave signal, which is capable of eliminating minute processing heretofore necessitated and attaining conversion in an ultra-high frequency band effectively.

Stated illustratively, the present invention has been achieved based on the finding that when a surface charge layer capacitance nonlinearity is imparted to a surface portion of the semiconductor under the electrode and an a.c. electrical signal having a frequency f is applied to said electrode, a surface wave having a frequency f/2 is produced due to parametric interaction and that the thus produced surface wave is propagated in the left and right direction of the electrode.

PREFERRED EMBODIMENTS OF THE INVENTION

Figure 1:
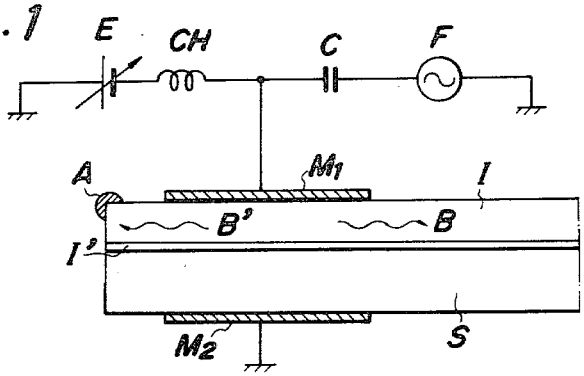
FIG. 1 is an electrical circuit diagram, showing a preferred form of an elastic surface wave device in accordance with the present invention.

Referring now to the drawings, there are illustrated preferred embodiments of the present invention.

In FIG. 1, character S designates a semiconductor substrate made of, for example, silicon (Si) etc., I a piezoelectric film made of zinc oxide (ZnO) etc., and I' a protective film such as a silicon oxide (SiO) film. The protective film I' acts as a stabilizing film for the surface of the semiconductor substrate S.

The semiconductor substrate S, the protective film I' and the piezoelectric film I comprise a laminate.

The laminate may alternatively have such construction that a piezoelectric material is used as a substrate and a semiconductor film is formed in a suitable manner on the piezoelectric substrate.

The semiconductor substrate S may be either of p-type or of n-type. In accordance with the type employed, a polarity of a d.c. bias voltage as mentioned later may be determined so as to produce a space charge layer at the surface portion of the semiconductor substrate S.

$M_1$ on the piezoelectric film I is a metal electrode for supply of a d.c. bias voltage and an a.c. electrical signal. The metal electrode $M_1$ is formed in a thin film for example by evaporation.

$M_2$ is an electrode for an ohmic contact with the semiconductor substrate S.

The electrode $M_1$ is connected to a ground through a choke coil CH for choking an a.c. current and a voltage variable-d.c. power source E for a d.c. bias voltage application.

This electrode $M_1$ is further connected to ground through a capacitor C for preventing a d.c. current and an a.c. electrical signal source F.

Character A designates a sound wave (surface wave) absorber for example made of silicone grease. This sound wave absorber A acts to absorb one of surface waves B, B' which propagate in the opposite directions, i.e. surface wave B' in the embodiment of FIG. 1, so as to operate the device as a unidirectional surface elastic wave transducer.

The so constructed surface elastic wave device in accordance with the present embodiment will operate as follows:

Explanation will be given referring to the case where an a.c. electrical signal is converted to a surface signal wave.

A suitable value of d.c. bias voltage is first applied from the voltage variable-d.c. power source E to the electrode $M_1$ to impart the semiconductor substrate S at its surface portion with a surface charge layer capacitance nonlinearity.

When an a.c. electrical signal having a frequency f is then supplied from the a.c. electrical signal source F to the electrode $M_1$, surface signal waves B, B' of a frequency f/2 is generated by the parametric interaction between the power of the a.c. electrical signal and the surface charge layer capacitance nonlinear characteristic. These surface signal waves B, B' are propagated in directions right and left of the electrode $M_1$ as viewed in FIG. 1.

At this time, if the frequency of the a.c. electrical signal to be supplied to the electrode $M_1$ is selected so as to be 2f, the frequency of the surface signal waves B, B' converted is f. Thus, when the frequency of the a.c. electrical signal is varied over a wide range, the surface signal waves B, B' having the corresponding frequency are generated.

The amplitude of the converted surface signal waves B, B' varies depending upon the length of the electrode $M_1$ in the propagation direction of the surface signal waves and the gain of the nonlinearity at the surface portion of the substrate.

The gain of the nonlinearity is determined by the surface charge layer capacitance nonlinearity which is in turn determined by a d.c. bias voltage value and the amount of the a.c. electrical signal power to be supplied.

Accordingly, in practical implementation, the frequency and power of the a.c. electrical signal and the gain of the nonlinearity may be suitably selected to produce a surface siganl wave of the corresponding frequency and the amplitude.

Furthermore, when a sound wave absorber A is mounted on one end of the piezoelectric material as shown in FIG. 1, the surface signal wave B' propagating in the direction towards the absorber is absorbed and not reflected, so that there is provided an unidirectional elastic surface wave transducer.

The foregoing description is given referring only to the conversion from an a.c. electrical signal to a surface signal wave, the conversion in the opposite direction, i.e., from a surface signal wave to an a.c. electrical signal is accomplished in substantially the same manner.

Though the piezoelectric material I is made of zinc oxide in the illustrated embodiment, it may alternatively be made of other piezoelectric materials such as lithium niobate ($LiNbO_3$), aluminum nitrate (AlN), cadmium sulfide (CdS), zinc sulfide (ZnS), etc.

In the light of the foregoing description, it is easily understood that in accordance with the present invention, a semiconductor and a piezoelectric material are formed into a laminate using them as a substrate and a film provided thereon, respectively, for providing a monolithic formation so that it can improve the reproducibility and attain the integration.

The present invention has a further advantage that since the configuration of the electrode mounted on the surface of the piezoelectric material may be freely designed and it may be of a plain sheet, there is no need to subject the material to elaborate processing so long as it can produce a necessary space charge layer.

As the present invention accomplishes the conversion between an a.c. electrical signal and a surface signal wave utilizing a parametric effect, the frequency range can be widened so that the conversion can be effected even in a ultra high frequency band, with an excellent efficiency, where conventional techniques cannot achieve the conversion.

Figure 2:
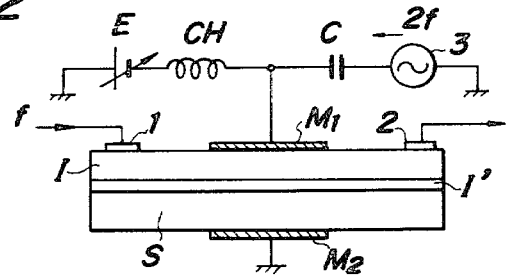
FIG. 2 is an electrical circuit diagram, showing an elastic surface wave amplifier in accordance with the present invention.

FIG. 2 shows another embodiment of the present invention, wherein the elastic surface wave device is applied for an amplifier. In the figure, like members are designated by like numerals or characters.

Figure 3:
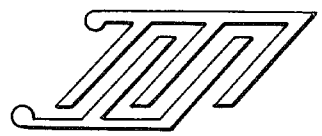
FIG. 3 shows one form of a comb electrodes employable in the amplifier shown in FIG. 2.

Numerals 1 and 2 designate input and output means, respectively, for electrical signals, and they include comb electrodes as shown in FIG. 3. At the input means 1, an electrical signal is converted to an elastic surface wave, and at the output means 2 the surface signal wave is converted to an electrical signal.

An electrode $M_1$ is connected to a ground through a capacitor C for preventing a d.c. current and a high-frequency power source 3 for supply of a pumping power.

The so constructed elastic surface wave amplifier in accordance with the present invention will operate as follows:

Upon supply of an electrical signal to the input means 1, the electrical signal is converted to a surface signal wave, which is then propagated at the surface portion of a piezoelectric material I towards the output means 2. The frequency of the surface signal wave being propagated is now assumed to be f. Then, when a pumping power having a frequency 2f is supplied to the electrode $M_1$ on the piezoelectric material I from a high-frequency power source 3 as well as a d.c. bias voltage from a d.c. power source E, the surface signal wave is amplified by a parametric interaction due to the surface charge layer capacitance nonlinearity at the surface portion of a semiconductor S under the electrode $M_1$. The so amplified surface signal wave is converted to an electrical signal by the output means 2 and drawn out.

The gain in the above-mentioned amplifying operation is expressed as a function of the length of the electrode $M_1$ in the propagation direction of the surface wave, the gain E of the nonlinearity at the surface portion of the semiconductor substrate, the frequency of the pumping power, etc. Accordingly, the gain can be varied by varying the values of the respective parameters.

The gain E of the nonlinearity is determined by a surface charge layer capacitance nonlinearity of the semiconductor which is in turn determined by a value of a d.c. bias voltage applied and the amount of the pumping power. Accordingly, in a practical application, these two parameters may be advantageously varied to regulate the gain.

Thus, in the elastic surface wave amplifier in accordance with the present invention, the amplification depends highly on the surface charge layer capacitance nonlinearity at the semiconductor substrate S of silicon etc. The effect due to this nonlinearity is by far excellent as compared with that of the conventional technique which utilizes nonlinearity of the piezoelectric material itself, which results in various advantages such that the required pumping power can be much reduced to obtain a given gain.

Figure 4:
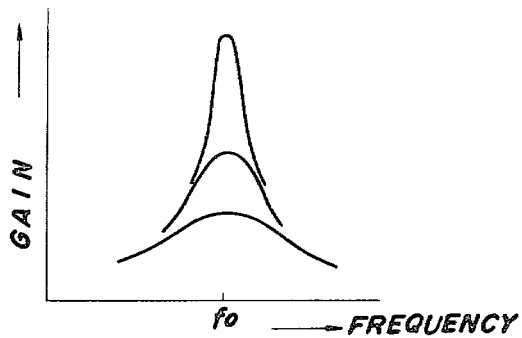
FIG. 4 is a diagram showing gain characteristics of the amplifier shown in FIG. 2, choosing Q as a parameter.

As the parametric amplifying effect of the elastic surface wave amplifier in accordance with the present invention is a kind of a positive feedback amplifying effect, an electrical quality factor Q is required to be improved to enhance the gain. One example of the frequency response of the gain with varying Q values is shown in FIG. 4. As apparent from the figure, a frequency band width can be varied as well as the gain. Thus, the amplifier of the present invention further has a variable band width-amplifying effect.

For supply of the pumping power having a frequency of 2f, one high-frequency power source 3 is employed in the embodiment shown in FIG. 2, but two or more high-frequency power sources may be employed so long as the beat frequency thereof is equal to 2f. For example, when high-frequency power sources having frequencies of $f_1$ and $f_2$, respectively, are employed, a power having frequency components of $f_1 \pm f_2$ and $nf_1 \pm mf_2$ is produced due to the nonlinearity at the surface portion of the semiconductor substrate.

If the frequency of the so obtained power is equal to 2f, it can accomplish the amplification of the surface signal wave as when one high-frequency power source is employed.

Though the foregoing description is given referring only to the pumping power having a frequency 2f, the frequency of the pumping power is not limited to 2f and it may be 4f, 6f, 8f . . .

In effect, however, the frequency of the pumping power is preferred to be 2f because the pumping power having a frequency 2f provides the maximum gain E of the nonlinearity. In this connection, it is to be noted that when the frequency of the pumping power is changed, the center frequency of the frequency band capable of being amplified is variable. In brief, the elastic surface wave amplifier in accordance with the present invention has a variable band width-amplifying function. Accordingly, it can work also as a band pass filter variable in frequency band width and center frequency.

Though, in the embodiment as shown in FIG. 2, the electrode $M_1$ is provided intermediate the input means 1 and the output means 2 and only the surface signal wave which is transmitted through the electrode $M_1$ and amplified is drawn out of the output means 2, the elastic surface wave amplifier in accordance with the present invention can essentially produce a reflected signal wave at a portion of the electrode $M_1$ as well as the transmitted signal wave and utilize the reflected wave signal for amplification effect as the transmitted signal wave. Accordingly, if the output is disposed intermediate the input means 1 and the electrode $M_1$, an electrical output can be drawn out by the reflected signal wave. In this case, however, it is required to employ a unidirectional elastic surface wave transducer as the output means.

The semiconductor to be employed may be either of p-type and n-type. The polarity of the d.c. power source for the bias voltage is chosen depending on the type selected, namely, p-type or n-type so as to produce a space charge layer at a surface portion of the semiconductor.

As the elastic surface wave amplifier in accordance with the present invention is so adapted that the surface wave signal may be amplified through the parametric amplification effect caused by supplying an a.c. pumping power from a high-frequency power source without causing a d.c. current to flow through the semiconductor, it has such an excellent effect that it can attain continuous wave without Joule heat generation.

Further, as the present invention utilizes the surface charge layer nonlinearity of the conductor obtained by application of a d.c. bias voltage, layer nonlinearity effect can be expected and accordingly the pumping power necessary to obtain a given gain can be reduced.

Still further, as the present invention utilizes the parametric amplifying effect by the surface charge layer nonlinearity, undesirable noise generation due to a thermal noise derived from resistors etc. can be well eliminated and amplification can be accomplished with an excellent S/N ratio.

What is claimed is:

1. An elastic surface wave device, comprising: a laminate composed of a semiconductor layer, a piezoelectric material layer, and a protective film layer interposed therebetween; a first electrode on a surface of said piezoelectric material layer; a d.c. bias voltage source connected to said first electrode; a pumping power source connected to said first electrode; and a second electrode on a surface of said semiconductor layer for ohmic contact therewith.

2. An elastic surface wave device as set forth in claim 1, wherein said piezoelectric material layer has input and output means for electrical signals disposed spacedly on its surface and in the propagating path of elastic surface waves.

3. An elastic surface wave device as set forth in claim 1, wherein said piezoelectric material layer has at its one end a surface wave absorber disposed thereon.

4. An elastic surface wave device as set forth in claim 1, wherein said semiconductor layer is made of silicon and said piezoelectric layer is made of zinc oxide.

* * * * *